United States Patent [19]

Mulder et al.

[11] Patent Number: 5,359,652
[45] Date of Patent: Oct. 25, 1994

[54] TONE RECEIVER COMPRISING A SWITCH CAPACITOR ZERO CROSSING DETECTOR

[75] Inventors: Jaap Mulder, Geldrop, Netherlands; Rolf F. Becker, Liswil, Switzerland

[73] Assignee: U.S. Philips Corporation, New York, N.Y.

[21] Appl. No.: 977,395

[22] PCT Filed: Jul. 1, 1992

[86] PCT No.: PCT/NL92/00115
§ 371 Date: Mar. 1, 1993
§ 102(e) Date: Mar. 1, 1993

[87] PCT Pub. No.: WO93/01687
PCT Pub. Date: Jan. 21, 1993

[30] Foreign Application Priority Data
Jul. 1, 1991 [EP] European Pat. Off. ........ 91201679.7

[51] Int. Cl.$^5$ .................. H03F 3/45; H03K 5/153
[52] U.S. Cl. .................. 379/386; 307/494; 307/362; 307/354
[58] Field of Search ............. 379/373, 386; 307/354, 307/362, 494; 328/115, 118

[56] References Cited

U.S. PATENT DOCUMENTS

| | | | |
|---|---|---|---|
| 3,697,782 | 10/1972 | Matouka | 307/354 |
| 4,176,286 | 11/1979 | Shuffield, Jr. | 307/362 |
| 4,237,390 | 12/1980 | Buurma | 307/362 |
| 4,345,169 | 8/1982 | Saleh | 307/354 |
| 4,523,107 | 6/1985 | Peterson | 307/362 |
| 4,707,624 | 11/1987 | Yee | 307/362 |
| 4,716,319 | 12/1987 | Rebeschini | 328/167 |
| 4,899,068 | 2/1990 | Klose et al. | 307/362 |
| 4,906,996 | 3/1990 | George | 341/118 |
| 5,182,476 | 1/1993 | Hanna et al. | 307/354 |

FOREIGN PATENT DOCUMENTS

| | | |
|---|---|---|
| 0008220 | 2/1980 | European Pat. Off. |
| 60-142613 | 7/1985 | Japan |
| 62-15918 | 1/1987 | Japan |

OTHER PUBLICATIONS

P. E. Fleischer, "A Single Chip Dual-Tone and Dial-Pulse Signaling Receiver" IEEE International Solid State Circuits Conference, vol. 25, 11 Feb. 1982, pp. 212–213.

Jorg Walter and Dr. Ernst Habekotte, "Integrierbare Funktionblocke und Systeme", Elektronik, vol. 39, No. 5, 2 Mar. 1990, pp. 100–110.

"A Monolthic Dual Tone Multifrequency Receiver" In IEEE Journal Of Solid State Circuits, vol. SC-14, No. 6, Dec. 1979.

Primary Examiner—James L. Dwyer
Assistant Examiner—Scott L. Weaver
Attorney, Agent, or Firm—David R. Treacy

[57] ABSTRACT

A zero crossing detector which compensates input offset voltage by switching connections between certain capacitors. A first capacitor connected in parallel with the comparator input, is charged to this offset value during one switching step. Part of this charge is transferred to an input series-connected capacitor during a next switching step. These steps are repeated at a high switching rate. Preferably, a voltage step source is applied to the first capacitor in that next step, and functions as a threshold during the comparison function. Once the threshold has been exceeded, the voltage step source is reversed.

5 Claims, 1 Drawing Sheet

TONE RECEIVER COMPRISING A SWITCH CAPACITOR ZERO CROSSING DETECTOR

BACKGROUND OF THE INVENTION

The invention relates to a tone receiver comprising a zero crossing detector which includes an amplifier circuit that has an inverting input and a non-inverting input. Such receivers are known, for example, from the article entitled "A monolithic dual tone multifrequency receiver" in IEEE Journal of Solid State Circuits, Vol. SC-14, No. 6, December 1979. These tone receivers may be used in telephone sets for detecting tone signals customary in telephony, such as DTMF signals (Dual Tone Multi Frequency).

Amplifier circuits having an inverting and a non-inverting input have the property of being capable of presenting an offset voltage i.e. it is possible that a voltage unequal to zero occurs at the output if there is a zero voltage difference between the two inputs. This offset voltage has a detrimental effect on the operation of the zero crossing detector, because the zero level of the amplifier/comparator input (that is, the input voltage which produces a zero voltage on the output) now no longer has a symmetrical position between the positive and negative input threshold voltages to be set. This may have the effect that the amplifier circuit acting as a comparator is energized by small interference signals which are smaller than the set threshold value.

SUMMARY OF THE INVENTION

It is an object of the invention to provide a tone receiver of the type mentioned in the opening paragraph, in which the offset voltage is compensated, so that the detrimental effect of the offset voltage is eliminated.

According to the invention, the tone receiver is characterized in that the zero crossing detector includes:
* an amplifier circuit used both as an amplifier and as a comparator, having an inverting input and a non-inverting input, the non-inverting input being coupled to a reference voltage source. The amplifier circuit has a feedback loop between the output and the inverting input, which includes a first on/off switch,
  * a first capacitor or capacitance between the two inputs,
  * a second capacitor between the signal input of the tone receiver and the inverting input of the amplifier,
  * a second on/off switch connected in series with the second capacitor,
  * and a control circuit which opens and closes the two on/off switches in phase opposition.

In a first control phase of the two switches, the first switch is closed (i.e. conductive), and the second switch is open. Consequently, the second capacitor is not connected to the amplifier and the output of the amplifier is connected directly to the inverting input. This causes the first capacitor to be charged to the offset voltage. In the second control phase of the switches, the first switch is open and the second switch is closed. The original charge of the first capacitor is now divided between the first and the second capacitor. These phases are repeated, so that the second capacitor will accumulate charge from the first capacitor or capacitance and eventually be charged to the offset voltage. In this situation and in the event of a zero input signal on the zero crossing detector, the offset voltage will be present on both inputs i.e. the actual offset voltage on the non-inverting input and the voltage across the second capacitor having the same magnitude on the inverting input. The result of this is that with a zero voltage input signal the output voltage is also zero.

An additional advantage of said measures is that also any DC voltage component present in the input signal is blocked. Such a component may have the same disturbing effect as the offset voltage.

An embodiment of the tone receiver according to the invention is characterized in that the zero crossing detector comprises:
* a third capacitor connected on one side via a third on/off switch to the non-inverting input of the amplifier circuit,
* connected to the other side of the third capacitor, a threshold voltage source for producing a threshold voltage signal which consists of a fixed step of voltage level,
* a fourth on/off switch, one side of which is connected to the junction of the third capacitor and the third on/off switch and the other side of which is connected to the reference voltage source, and a fifth switch for disconnectably coupling the reference voltage source to the non-inverting input of the amplifier circuit, the fifth switch being opened and closed in phase with the fourth switch,
* which third and fourth switches are opened and closed in phase with the second switch and the first switch respectively, by the control circuit.

These measures achieve that the zero crossing detector can produce a threshold voltage, so that minor interference signals such as noise do not activate the detector. This threshold voltage presents hysteresis i.e. once the detector has been activated in reaction to, for example, an upward crossing of a positive threshold voltage, the threshold voltage is then rendered negative and vice versa. This is advantageous in that a signal varying around the threshold voltage will not constantly reverse the zero crossing detector.

Because the threshold voltage generator repeatedly generates voltage steps, the series combination of the first, the second and the third capacitor is charged. The first and third capacitors are also repeatedly discharged (the former because it is repeatedly connected to the output of the amplifier by the first switch and the latter because it is repeatedly connected to the reference voltage by the fourth switch). The second capacitor, however, is not repeatedly discharged and it is conceivable that as a result the proper operation of the zero crossing detector is affected detrimentally. In order to avoid this situation the tone receiver according to a further embodiment of the invention is characterized, in that the threshold voltage source in the tone receiver comprises means for producing, within a switch-on interval of the second switch after said threshold voltage step, a voltage step of equal magnitude and opposite polarity. The equally large voltage step of opposite polarity will now discharge the third capacitor by the same charge as the one it had been charged with.

The invention will be further explained with reference to the drawings.

DESCRIPTION OF THE PREFERRED EMBODIMENT

Figure 1:
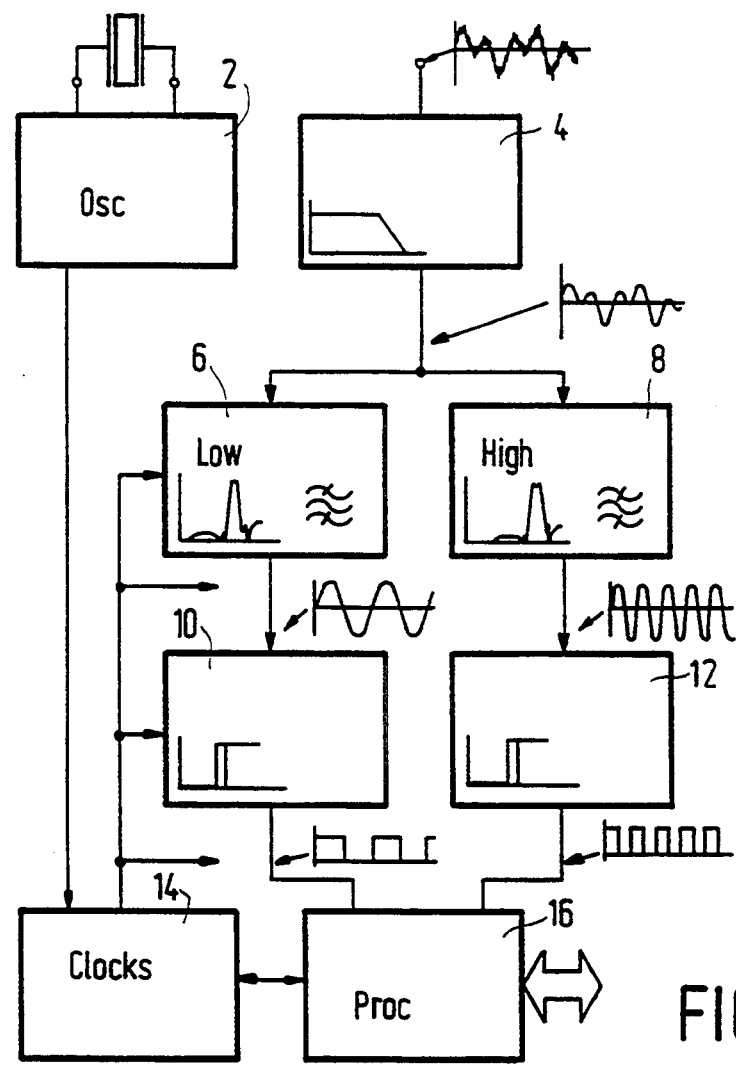
FIG. 1 shows a block diagram of a tone receiver according to the invention.

The tone receiver as shown in FIG. 1 may be used in a telephone set. The incoming signal is first applied to an anti-aliasing filter 4. The function of this filter is to reject the mixing frequencies developing during signal sampling. The output of this filter is connected to two filters 6 and 8 for band splitting and rejecting undesired signals. In the DTMF mode the two filters operate at fixed bandpass frequencies; in the signalling tone mode one of these filters is switched off. The other filter is then adjustable in a number of frequency bands whose pass band is somewhere in the range between 80 Hz and 3400 Hz. The output signal of the filters 6 and 8 are applied to zero crossing detectors 10 and 12. These detectors will be described in detail with reference to FIG. 2. The output signal of each of the zero crossing detectors is applied to a digital processor 16 which further evaluates signals and controls the various circuit elements including the zero crossing detector. Each of the blocks shown in FIG. 1 is supplied with clock signals derived from a crystal oscillator 2 with a frequency of, for example, 3.58 MHz. The exact frequency and phase of the clock signals are produced in a clock divider circuit 14. At the inputs of the various blocks in the drawing Figure there is shown diagrammatically which signal form is applied to each block.

Figure 2:
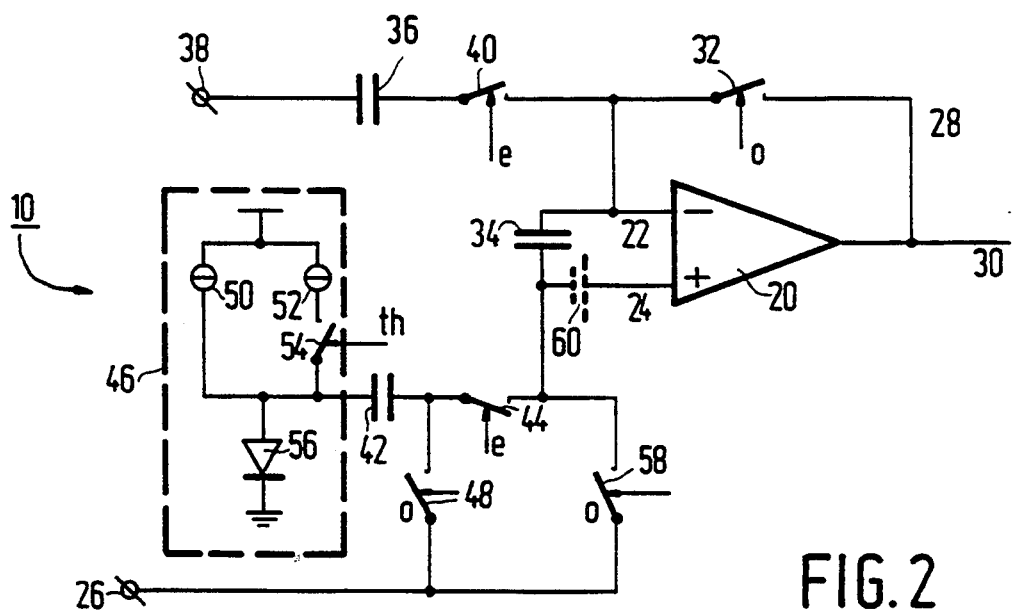
FIG. 2 shows a zero crossing detector to be used in a tone receiver according to the invention.

Drawing FIG. 2 shows in more detail a zero crossing detector such as, the detector 10 shown in FIG. 1. This zero crossing detector comprises an amplifier circuit 20 acting as an amplifier/comparator combination and having an inverting input 22 and a non-inverting input 24. This non-inverting input 24 is connected by means of a switch 58 to a reference source 26 (not shown). The amplifier circuit further includes a feedback loop 28 which includes a switch 32; this feedback loop is situated between the output 30 of the amplifier and the inverting input 22. A capacitor 34, which may be formed by the parasitic capacitance of the input stage of the amplifier circuit 20, is connected between the inverting input 22 and the non-inverting input 24. A series combination of a capacitor 36 and a switch 40 is situated between the signal input 38 of the zero crossing detector and the inverting input 22.

The non-inverting input 24 is also connected to a threshold voltage source 46 via a switch 44 and a capacitor 42. A further switch 48 is inserted between the reference voltage 26 and the junction of capacitor 42 and switch 44. The threshold voltage source 46 comprises a parallel combination of a current source 50, on the one hand, and a series combination of a current source 52 and a switch 54, on the other. These two current sources apply their current to a forward biased diode 56.

The switches in this zero crossing detector are preferably arranged as complementary CMOS gates known per se. The advantage of CMOS transistors is that in the open state (non-conductive) they present a very high resistance between drain and source, whereas the control electrode, as a result of its capacitive coupling to the drain-source path, hardly draws a charge from the elements driving the control electrode.

For the elucidation of the operation of the zero crossing detector it is assumed that the non-inverting input is connected to a fixed voltage i.e. via switch 58 and reference 26. The switches of the zero crossing detector are driven with a frequency that is high relative to the signals to be received, for example, several hundred kHz. In one phase of the operating interval of the zero crossing detector a number of switches are closed (i.e. conductive); these switches are symbolically denoted by "e" (even) in FIG. 2, whereas the other switches are denoted by "o" (odd). Even switches are in phase opposition to the odd switches i.e. one type of switch is open, whereas the other type is closed and vice versa. Only switch 54 is not of the control type described hereinbefore, as will be explained hereinafter.

The operation of the zero crossing detector as an offset voltage compensation circuit is as follows:

In a first phase of the operation of the detector, switch 58 is closed and the non-inverting input 24 is connected to reference 26 via switch 58. The offset at the input is symbolically represented by means of a voltage source 60. In this phase also switch 32 is closed, so that the inverting input 22 is connected to output 30; and switch 48 is closed, as will be described below with respect to the threshold voltage. Since a feedback differential amplifier always tries to drive the two inputs to the same voltage, the offset voltage will now be present across capacitor 34. In the next phase switches 32, 48 and 58 are open and the switches 44 and 40 are closed. The charge of capacitor 34 will now partly flow to capacitor 36 which is charged as a result. In the next phase capacitor 34 is charged again to the offset voltage while the junction between capacitor 36 and open switch 40 is free from other connections so that the charge on capacitor 36 remains unaffected after which, in a next phase, again part of this offset voltage flows to capacitor 36. This process is continued until the whole offset voltage is present across capacitor 36. Assuming that no input signal is present on input 38, the side of capacitor 36 connected to the inverting input has been brought to the level of the offset voltage, and so has the inverting input. Because this is also the case with the non-inverting input, there is no longer a voltage difference between the two inputs and neither is there an offset effect any longer.

For recognizing that the zero crossing detector also blocks any DC component $V_{DC}$ present in the input signal, it is again assumed that input 24 is connected to the reference 26. With an open switch 32 and a closed switch 40 the capacitors 36 and 34 are charged by $V_{DC}$. In the next phase the two switches are reversed, so that the charge of capacitor 34 is hulled; the charge of capacitor 36 is maintained. In the next phase $V_{DC}$ again charges the two capacitors, after which the capacitor 34 is discharged. This is continued until the complete $V_{DC}$ is present across capacitor 36, which means that the DC component in the input signal is blocked.

The zero crossing detector according to the invention is arranged for producing a threshold voltage which, in addition, is reversed to a value of opposite sign once the input signal has exceeded the threshold voltage. This effect of hysteresis avoids that the detector is constantly reversed by a signal that remains in the neighbourhood of the threshold voltage for some time. The threshold voltage is produced as follows:

During the even phase (thus when switches 44 and 40 are closed), switch 54 is either being opened or closed. In either case the current flowing through diode 56 will vary by a step size, so that the voltage present across the diode will also present a (small) step in voltage level. This voltage step is transferred to capacitor 34 by capacitor 42. Capacitor 34 is considerably smaller than either of the two capacitors 42 and 36. This means that substantially the whole voltage step is present across capacitor 34. For reversing the amplifier 20 acting as a comparator, the input voltage is to exceed this voltage present across capacitor 34. This procedure thus creates the threshold voltage.

Once the comparator has reversed, this is detected by the digital processor (see FIG. 1) connected to the zero crossing detector. This processor controls, for example, the operation of switch 54. It is assumed that, initially, a positive threshold voltage had been set. If the threshold is exceeded by the input signal, the detector output reverses. This is detected by the processor which, in response, controls switch 54 so that this switch is closed at the beginning of the "even" period. Shortly after the beginning of this period, switch 54 is opened, so that threshold voltage source 46 produces a negative current step, thus also a negative step in voltage level. This negative voltage step becomes present across capacitor 34 in above fashion, so that the input signal is to have a more negative value for reversing the comparator. This procedure thus creates the negative threshold voltage.

It is advantageous to have the current step of threshold voltage source 46 effected again in reverse order just before the end of the even period. As a result, all capacitors allowing the current step to pass through, are now discharged by an opposite current step. This prevents accumulating charge in one direction particularly on capacitor 36, which is not discharged during the entire operation cycle of the zero crossing detector, and would otherwise be charged to an unacceptably high voltage value.

We claim:

1. A tone receiver comprising a control circuit and at least one zero crossing detector, wherein said detector comprises:
   a signal input for receiving an input signal,
   a reference voltage source,
   a first on/off switch,
   amplifier means for amplifying and comparing said input signal and a reference signal, said amplifier means comprising a non-inverting input coupled to said reference voltage source, an inverting input, an output coupled to said inverting input by a feedback loop through said first on/off switch, and a first capacitance coupling between said inverting and non-inverting inputs,
   a second capacitor and a second on/off switch connected in series between said inverting input and said signal input, a junction between said second capacitor and said second on/off switch being free from other connections when said second on/off switch is open, and
   means, responsive to said control circuit, for opening and closing said on/off switches in phase opposition, said second capacitor thereby accumulating charge from said first capacitance.

2. A receiver as claimed in claim 1, wherein said amplifier means has an input stage having a parasitic capacitance, said parasitic capacitance forming said first capacitance.

3. A tone receiver comprising a control circuit and at least one zero crossing detector, wherein said detector comprises:
   a signal input for receiving an input signal,
   a reference voltage source, and a threshold voltage source producing a threshold voltage signal having a fixed step in voltage level,
   a first, a second, a third and a fourth on/off switch, said third on/off switch having a first terminal and a second terminal,
   amplifier means for amplifying and comparing said input signal and a reference signal, said amplifier means comprising a non-inverting input disconnectably coupled to said reference voltage source, an inverting input, an output coupled to said inverting input by a feedback loop through said first on/off switch, and a first capacitance coupling between said inverting and non-inverting inputs,
   a second capacitor connected between said inverting input and said signal input through said second switch,
   a third capacitor having one terminal connected to said threshold voltage source, and an other terminal connected to a junction with said first terminal of said third on/off switch, said third on/off switch having said second terminal connected to said non-inverting input,
   said fourth on/off switch being connected between said junction and said reference voltage source, and
   means, responsive to said control circuit, for opening and closing said first and said second on/off switches in phase opposition, and for opening and closing said third and fourth on/off switches in phase with said second switch and said first switch respectively, and for controlling the disconnectable coupling of said reference voltage to said non-inverting input in phase with said first switch.

4. A receiver as claimed in claim 3, wherein said amplifier means has an input stage having a parasitic capacitance, said parasitic capacitance forming said first capacitance.

5. A receiver as claimed in claim 3, comprising means for determining a step interval of time within a period of time that said second switch is closed following said fixed step in voltage level,
   wherein said threshold voltage source, responsive to said means for determining, produces a further step in voltage level of equal magnitude and opposite polarity to said fixed step in voltage level.

* * * * *